United States Patent
Weidner et al.

(10) Patent No.: US 8,809,180 B2
(45) Date of Patent: Aug. 19, 2014

(54) PRODUCING SIC PACKS ON A WAFER PLANE

(75) Inventors: Karl Weidner, München (DE); Robert Weinke, München (DE)

(73) Assignee: Siemens Aktiengesellschaft, Munich (DE)

( * ) Notice: Subject to any disclaimer, the term of this patent is extended or adjusted under 35 U.S.C. 154(b) by 1406 days.

(21) Appl. No.: 11/816,186

(22) PCT Filed: Dec. 21, 2005

(86) PCT No.: PCT/EP2005/057042
§ 371 (c)(1),
(2), (4) Date: Oct. 17, 2007

(87) PCT Pub. No.: WO2006/084524
PCT Pub. Date: Aug. 17, 2006

(65) Prior Publication Data
US 2008/0128710 A1    Jun. 5, 2008

(30) Foreign Application Priority Data

Feb. 14, 2005  (DE) .......................... 10 2005 006 639

(51) Int. Cl.
| | |
|---|---|
| H01L 21/44 | (2006.01) |
| H01L 21/66 | (2006.01) |
| H01L 21/00 | (2006.01) |
| H01L 21/48 | (2006.01) |
| H01L 21/04 | (2006.01) |

(52) U.S. Cl.
CPC ........ *H01L 21/4853* (2013.01); *H01L 21/0445* (2013.01); *H01L 22/00* (2013.01); *H01L 21/4846* (2013.01)
USPC ............... 438/598; 438/17; 438/33; 438/599; 257/E21.521

(58) Field of Classification Search
CPC ............ H01L 29/1608; H01L 21/0445; H01L 21/4853; H01L 21/4846; H01L 22/00; H01L 22/20
USPC .......................... 438/17, 18, 33, 68, 598, 599; 257/E21.521, E21.522, E21.525, 257/E21.526, E21.532
See application file for complete search history.

(56) References Cited

U.S. PATENT DOCUMENTS

| | | |
|---|---|---|
| 4,703,436 A | 10/1987 | Varshney |
| 5,446,310 A | 8/1995 | Baliga et al. |

(Continued)

FOREIGN PATENT DOCUMENTS

| | | |
|---|---|---|
| DE | 35 03 433 A1 | 8/1995 |
| WO | WO 03/030247 A | 4/2003 |

OTHER PUBLICATIONS

Guo-Quan Lu et al: "3-D. Bond—Wireless Interconnection of Power Devices in Modules Will Cut Resistance, Parasitics and Noise" PCIM Power Electronic Systems; Intertec International, Ventura, CA, US, vol. 26, No. 5, May 2000, pp. 40, 46-48, 65, XP009053854 ISSN: 1523-4908.

*Primary Examiner* — Shouxiang Hu
(74) *Attorney, Agent, or Firm* — Laurence A. Greenberg; Werner H. Stemer; Ralph E. Locher

(57) ABSTRACT

A method for producing at least one semiconductor component group, in particular a SiC semiconductor component group, includes the step of producing a number of semiconductor components on a substrate, particularly on a wafer. The individual semiconductor components are tested for detecting operative semiconductor components. At least one semiconductor component group is assembled, which is formed of a number of operative semiconductor components and which forms a coherent flat structure. The operative semiconductor components of the semiconductor component group are electrically connecting in parallel.

6 Claims, 1 Drawing Sheet

(56) References Cited

U.S. PATENT DOCUMENTS

| | | |
|---|---|---|
| 5,817,533 A | 10/1998 | Sen et al. |
| 5,843,799 A | 12/1998 | Hsu et al. |
| 6,379,998 B1 | 4/2002 | Ohta et al. |
| 6,514,779 B1 | 2/2003 | Ryu et al. |
| 7,230,273 B2 * | 6/2007 | Kitabatake et al. ............. 257/76 |
| 2004/0248330 A1 | 12/2004 | Kitabatake et al. |

* cited by examiner

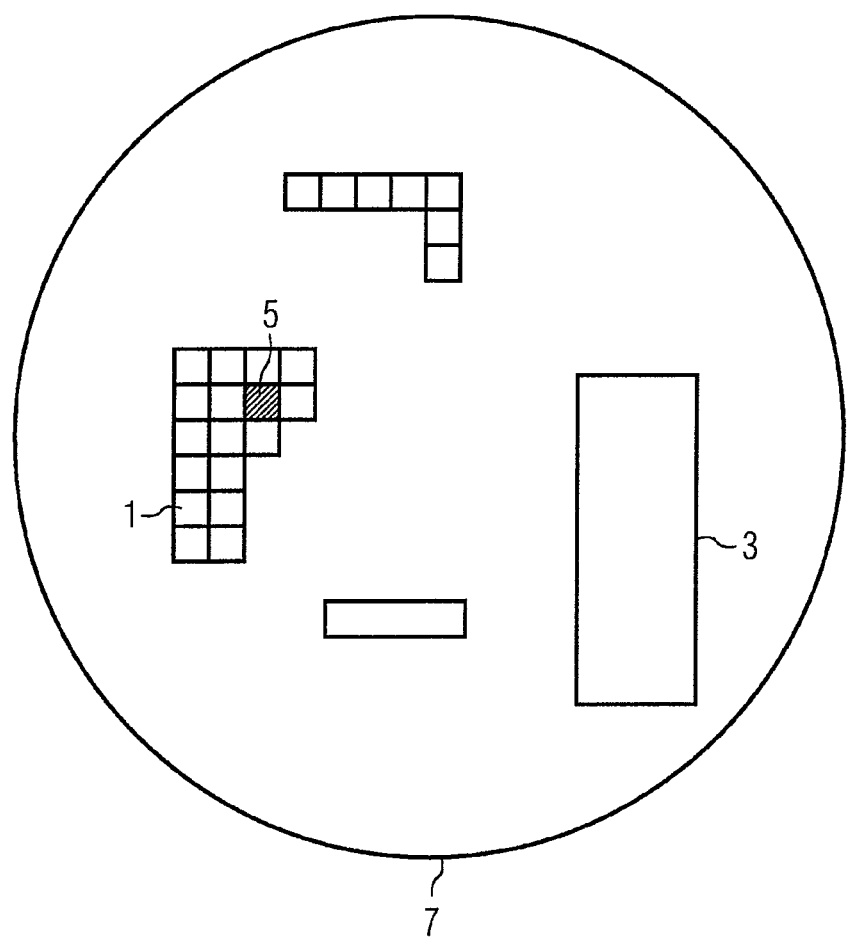

PRODUCING SIC PACKS ON A WAFER PLANE

BACKGROUND OF THE INVENTION

Field of the Invention

The present invention relates to a method according to the preamble of the main claim and a device according to the preamble of the sub-claim.

SiC semiconductor components only have a limited current uptake capacity or current-carrying capacity. In SiC semiconductor components or SiC chips the current conductivity is limited to about 10 A according to the prior art.

SUMMARY OF THE INVENTION

The object of the present invention is therefore to increase the limited current-carrying capacity of SiC semiconductor components effectively and in a simple and cost-effective manner.

This object is achieved by a method as claimed in the main claim and by a device as claimed in the additional claim. Further advantageous embodiments are found in the sub-claims.

By targeted parallel connecting of SiC chips on a wafer plane, the current-carrying capacity is increased considerably. As a result, simple and cost-effective production of "SiC packs" (sets of SiC semiconductor components) with a higher current-carrying capacity is achieved.

At least one semiconductor component set, in particular an SiC semiconductor component set, is produced with the following steps in particular: creation of a plurality of semiconductor components on a substrate, in particular on a wafer; testing the individual semiconductor components to detect operational semiconductor components; assembling at least one semiconductor component set which is comprised of a plurality of operational semiconductor components and which forms a coherent flat structure; and electrical connection in parallel of the operational semiconductor components of the semiconductor component set. The coherent flat structure lies in a cross-sectional plane that runs through the substrate or the wafer at the height of the semiconductor components. In other words, the coherent flat structure can be detected from above in a horizontal sectional plane, running through the semiconductor elements. Detection is also possible in a top view from above onto the substrate or onto the wafer. By means of the coherent flat structure, simple electrical connection in parallel of the semiconductor components can be carried out.

According to an advantageous embodiment, the assembly of the semiconductor components set ensues in such a way that the coherent flat structure continues to remain mechanically stable once the structure has been released from the substrate, in particular from the wafer. In other words, the flat structure is selected accordingly. Basically, stability can likewise be generated along the height of the wafer. This means that in cases where only two corners of the semiconductor components are adjacent to each other, the flat structure can still be stable at this point if necessary.

According to an advantageous embodiment, the assembly of the semiconductor component set ensues in such a way that, in the coherent flat structure, two respective operational semiconductor components are adjacent to each other along a common linear section. Here the common linear section of the coherent flat structure likewise runs through the semiconductor components in the horizontal cross-sectional plane.

According to an advantageous embodiment, the assembly of the semiconductor component set ensues in such a way that selected defective semiconductor components are added to the coherent flat structure.

According to an advantageous embodiment, the assembly of the semiconductor component set ensues in such a way that the number of defective semiconductor components in the coherent flat structure is minimal. In other words, in the event that defective semiconductor components are required to create mechanical stability, the number thereof should be as low as possible. As a result, the coherent flat structure can be made as small as possible.

According to an advantageous embodiment, the assembly of the semiconductor component set ensues in such a way that the coherent flat structure has edges that are disposed at right angles to each other. As a result, the release of the semiconductor components, in particular the cutting out thereof, can be executed in a simple manner, in particular by sawing.

According to an advantageous embodiment, the assembly of the semiconductor components ensues in such a way that the coherent flat structure is a rectangle, in particular a square. With these flat structures, release is very effectively simplified.

According to an advantageous embodiment, the establishing of contacts between one or a plurality of electrical contacting surfaces of a manufactured semiconductor component set ensues in particular on a surface of a substrate, in particular comprising the steps: application of a layer of electrically insulating material onto the surfaces of the semiconductor component set and optionally of the substrate, uncovering of each contact surface with which contact is to be established on the surface of the semiconductor component set and optionally of the substrate by opening the respective windows in the layer of electrically insulating material and making of contacts in a plane manner between each contact surface that has been uncovered and a layer of electrically insulating material. Contacts can be established in the semiconductor component set only. The semiconductor component set can be disposed on a substrate and/or a wafer. Said substrate or wafer may likewise have contact surfaces that similarly have contacts in a plane manner according to the contact surfaces of the semiconductor component set.

According to an advantageous embodiment, the application of the layer of electrically insulating material ensues, for example, by means of Physical Vapor Deposition (PVD) and Plasma Ion Assisted Deposition (PIAD). This relates in particular to the provision of a glass coating.

According to a further advantageous embodiment, the layer of electrically insulating material is applied in a plane manner or in a pre-structured or structured manner. In the event of structured application thereof, the layer is created in a structured manner during the application process. For example, templates can be used.

According to a further advantageous embodiment, after the making of contacts in a plane manner in and/or on the layer of electrically insulating material, formation of a least one strip conductor ensues. This can take place on the semiconductor component set of and/or on the substrate and/or on the wafer.

According to an advantageous embodiment, there ensues the production of a device comprising semiconductor components, in particular SiC semiconductor components, wherein in particular at least one semiconductor component set consisting of a plurality of operational semiconductor components is created and forms a coherent flat structure, wherein the operational semiconductor components of the semiconductor component set are electrically connected to one another in parallel. The semiconductor component set is preferably disposed on a substrate.

According to an advantageous embodiment, establishing of contacts ensues on at least one contact surface of at least one semiconductor component set, wherein a layer of electrically insulating material sits close to the semiconductor component set and, on the contact surface on the semiconductor component set, comprises a window in which said contact surface is free of foil and establishes contact with a layer of electrically insulating material in a plane manner. The semiconductor component set can be disposed on its own or on a substrate and/or on a wafer. The substrate or the wafer may likewise have contact surfaces which establish contact in a plane manner in a similar way to the semiconductor component set, and in particular have identically produced strip conductors.

According to an advantageous embodiment, the layer of electrically insulating material is a foil, an insulating varnish and/or a glass coating.

The present invention is described in more detail by means of an exemplary embodiment together with FIG. 1.

BRIEF DESCRIPTION OF THE DRAWING

FIG. 1 shows:
A top view onto a horizontal intersecting plane through semiconductor components on a wafer, and in particular before the release of the sets of semiconductor components.

DESCRIPTION OF THE INVENTION

FIG. 1 shows a top view onto a horizontal intersecting plane through semiconductor components 1 and 5 on a wafer 7, actually before the release of the semiconductor component sets 3. Reference sign 1 denotes operational semiconductor components and reference sign 5 denotes defective semiconductor components. In FIG. 1, semiconductor components 1 and 5 are adjacent to each other via common edges. The defective semiconductor component 5 in the left-hand semiconductor component set 3 is a component of said semiconductor component set 3 and increases the mechanical stability thereof. Preferred coherent flat structures have the shape of a rectangle. The semiconductor component set 3 can be sawn out of the wafer 7 in a simple manner. Other methods to release it, for example using a laser, can likewise be used. Basically all shapes of a coherent flat structure are usable. Basically the surface, can for example, likewise take the shape of an oval or a circle or a triangle or a square.

The semiconductor component set 3 released therefrom can be provided with contacts in a simple manner according to what is known as SiPlit technology (Siemens Planar Interconnect Technology) according to WO 2003030247-A2. The content thereof relates expressly to the disclosure of the present application. According to that document, the establishing of contacts ensues with at least one contact surface on at least one semiconductor component set 3 on the surface of a substrate, wherein a foil sits close to the semiconductor component set 3 and has a window on the contact surface on the semiconductor component set 3, in which window said contact surface is free of foil and establishes contact in a plane manner with a layer of electrically conductive material. According to an advantageous embodiment, the formation of at least one strip conductor ensues after contact has been made in a plane manner in and/or on the layer of electrically conductive material.

According to an advantageous embodiment, as an alternative to a one-sided metallization, a double-sided metallization for example, of copper, can be applied to the foil. Thus the copper is additionally likewise located beneath the foil. An upper metal layer can additionally be provided as a hermetic seal. Thus a series of layers can be created: covering, copper foil, insulating foil and substrate. Application of copper contacts can be achieved by soldering, adhesion, in particular contact adhesion. The hermetic covering on top of the metallized foil can be provided in such a way that a metal connection to ceramic is provided. Alternatively or additionally to a multilayer structure, two-sided cooling can be generated.

The invention claimed is:

1. A method for producing at least one semiconductor component set, which comprises the steps of:
producing a plurality of semiconductor components on a substrate;
testing the semiconductor components to detect operative semiconductor components;
composing at least one semiconductor component set formed of a plurality of the detected operative semiconductor components to form a coherent flat structure;
carrying out the composing step such that the coherent flat structure, after a release thereof from the substrate, is mechanically stable, such that in the coherent flat structure, respectively, two operative semiconductor components border each other along a common linear section, such that selected defective semiconductor components are added to the coherent flat structure and such that a number of the defective semiconductor components in the coherent flat structure is minimal;
releasing the composed coherent flat structure from the substrate; and
after the releasing step, electrically connecting the operative semiconductor components of the semiconductor component set in parallel.

2. The method according to claim 1, which further comprises composing the semiconductor component set such that the coherent flat structure contains edges that are disposed at right angles to each other.

3. The method according to claim 2, which further comprises composing the semiconductor component set such that the coherent flat structure is rectangle.

4. The method according to claim 1, which further comprises providing a wafer as the substrate.

5. The method according to claim 1, which further comprises forming the semiconductor component set as a SiC semiconductor component set.

6. The method according to claim 2, which further comprises composing the semiconductor component set such that the coherent flat structure is square.

* * * * *